(12) United States Patent
Choi et al.

(10) Patent No.: US 9,997,738 B2
(45) Date of Patent: Jun. 12, 2018

(54) ORGANIC LIGHT EMITTING DISPLAY APPARATUS AND METHOD OF MANUFACTURING THE SAME

(71) Applicant: Samsung Display Co., Ltd., Yongin-si, Gyeonggi-do (KR)

(72) Inventors: Jonghyun Choi, Yongin-si (KR);
Seungyong Song, Yongin-si (KR);
Hyangshik Kong, Yongin-si (KR);
Jangdoo Lee, Yongin-si (KR); Suyeon Sim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 52 days.

(21) Appl. No.: 15/332,742

(22) Filed: Oct. 24, 2016

(65) Prior Publication Data
US 2017/0149014 A1 May 25, 2017

(30) Foreign Application Priority Data
Nov. 20, 2015 (KR) .................. 10-2015-0163453

(51) Int. Cl.
*H01L 51/56* (2006.01)
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3244* (2013.01); *H01L 51/003* (2013.01); *H01L 51/0097* (2013.01); *H01L 51/56* (2013.01); *H01L 2227/323* (2013.01); *H01L 2227/326* (2013.01); *H01L 2251/5338* (2013.01)

(58) Field of Classification Search
CPC .. H01L 51/56; H01L 51/5253; H01L 27/3244
See application file for complete search history.

(56) References Cited

U.S. PATENT DOCUMENTS

| | | | |
|---|---|---|---|
| 2014/0133282 A1 | 5/2014 | Hamm | |
| 2014/0287230 A1 | 9/2014 | Walls et al. | |
| 2014/0339517 A1* | 11/2014 | Park | H01L 51/5253 257/40 |

(Continued)

FOREIGN PATENT DOCUMENTS

| | | |
|---|---|---|
| JP | 2014-96355 A | 5/2014 |
| KR | 10-2009-0074997 A | 7/2009 |
| KR | 10-2016-0080310 A | 7/2016 |

*Primary Examiner* — Lex Malsawma
*Assistant Examiner* — Xia Cross
(74) *Attorney, Agent, or Firm* — Lewis Roca Rothgerber Christie LLP

(57) ABSTRACT

A method of manufacturing an organic light emitting display apparatus includes: preparing a substrate having a first surface and a second surface opposite to the first surface; forming a through-hole penetrating the substrate from the first surface to the second surface; forming a humidity preventing layer on the substrate; forming a plurality of organic light emitting diodes on the substrate; and removing an organic light emitting diode adjacent to the through-hole from among the plurality of organic light emitting diodes, in which the humidity preventing layer may be formed on the substrate via a sequential vapor infiltration (SVI) process.

13 Claims, 8 Drawing Sheets

(56) References Cited

U.S. PATENT DOCUMENTS

| | | | |
|---|---|---|---|
| 2015/0021565 A1* | 1/2015 | Min | H01L 51/5256 257/40 |
| 2015/0243846 A1* | 8/2015 | Kwon | H01L 33/62 257/13 |
| 2016/0190389 A1 | 6/2016 | Lee et al. | |

* cited by examiner

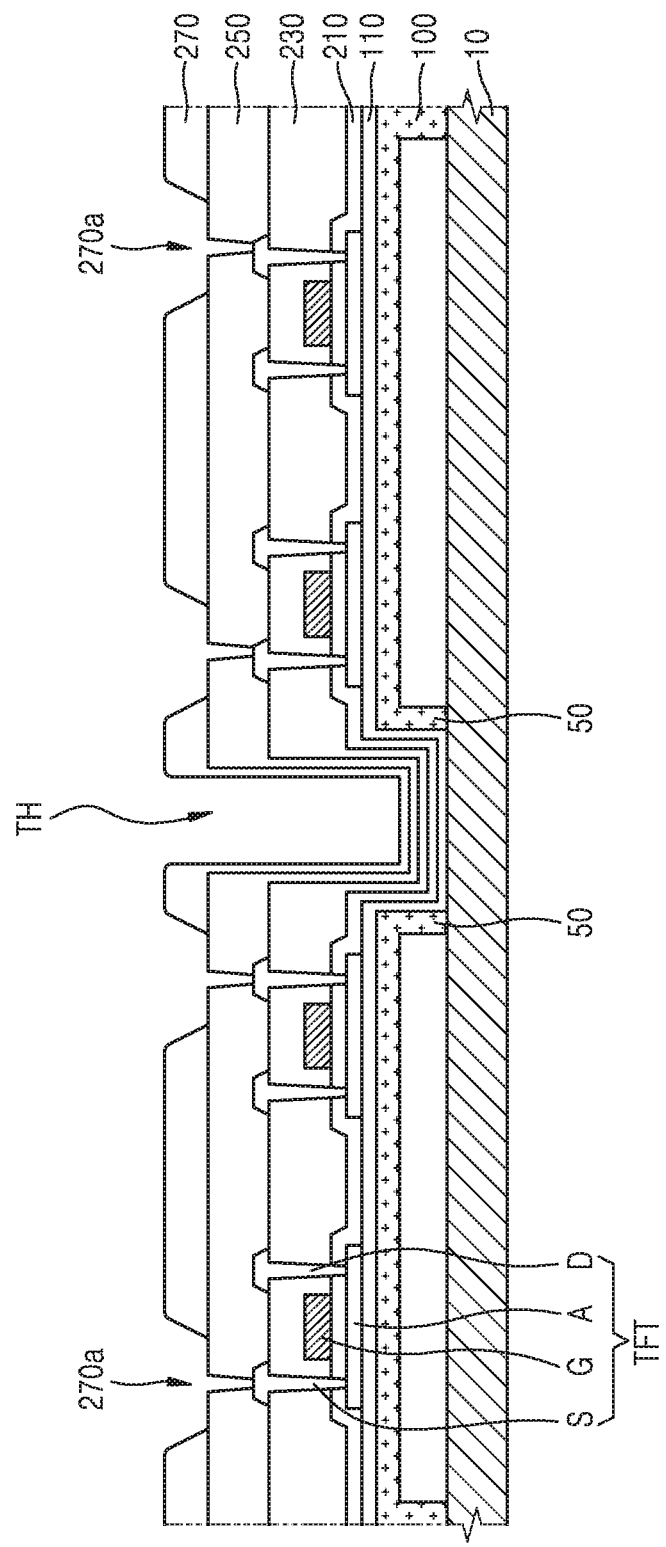

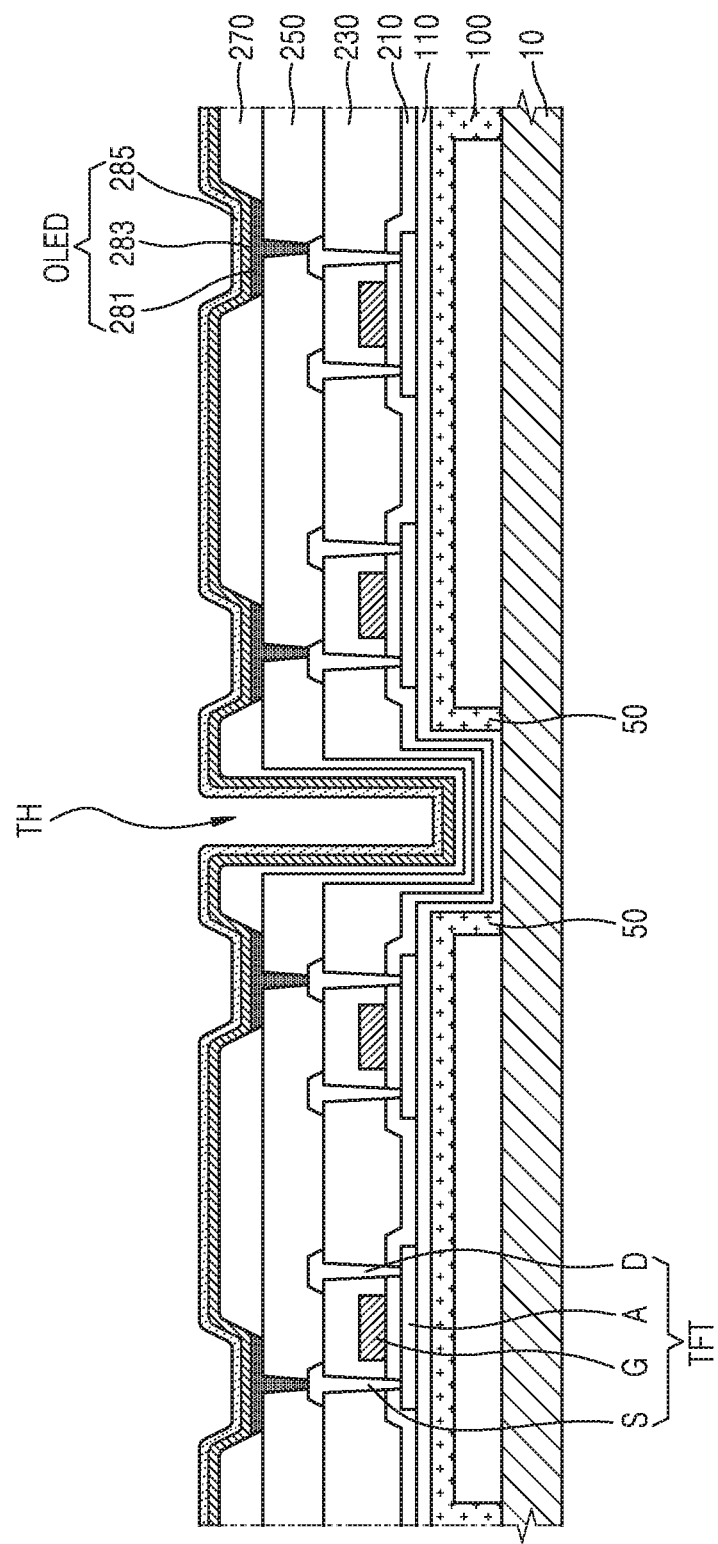

ORGANIC LIGHT EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2015-0163453, filed on Nov. 20, 2015, in the Korean Intellectual Property Office, the disclosure of which is incorporated herein in its entirety by reference.

BACKGROUND

1. Field

One or more embodiments relate to an organic light emitting display apparatus and a method of manufacturing the organic light emitting display apparatus.

2. Description of the Related Art

Recently, application areas of display apparatuses have been diversified. In addition, application ranges of display apparatuses have become much wider (e.g., broader) because display apparatuses have become thinner and lighter.

For example, a lot of display apparatuses have been recently studied and manufactured as flat panel display (e.g., flat-type display) apparatuses.

As display apparatuses may be formed as flat panel display apparatuses (e.g., in a flat-type), shapes of the display apparatuses may be designed utilizing various suitable methods, and the number of functions which may be combined with or linked to display apparatuses has increased also.

SUMMARY

An aspect according to one or more embodiments of the present invention is directed toward an organic light emitting display apparatus including an opening unit.

Additional aspects will be set forth in part in the description which follows and, in part, will be apparent from the description, or may be learned by practice of the presented embodiments.

According to one or more embodiments, a method of manufacturing an organic light emitting display apparatus includes: preparing a substrate having a first surface and a second surface opposite to the first surface; forming a through-hole penetrating the substrate from the first surface to the second surface; forming a humidity preventing layer on the substrate; forming a plurality of organic light emitting diodes on the substrate; and removing an organic light emitting diode adjacent to the through-hole from among the plurality of organic light emitting diodes, in which the humidity preventing layer may be disposed on the substrate via a sequential vapor infiltration (SVI) process.

In an embodiment, the substrate may have a third surface perpendicular to the second surface, and the humidity preventing layer may be disposed on an outskirt portion of the substrate adjacent to the second and third surfaces.

In an embodiment, the humidity preventing layer may be an organic/inorganic composite layer.

In an embodiment, the substrate may include an organic material and a free volume.

In an embodiment, the humidity preventing layer on the substrate may be formed via the SVI process, in which an inorganic precursor penetrates into the free volume.

In an embodiment, the substrate may be on a carrier substrate in preparing the substrate.

In an embodiment, the method may further include forming a circuit unit on the substrate and the carrier substrate after the forming of the humidity preventing layer on the substrate and before the forming of the plurality of organic light emitting diodes on the substrate.

In an embodiment, the method may further include forming an encapsulating unit encapsulating the organic light emitting diode on the substrate and the carrier substrate after the forming of the plurality of organic light emitting diodes on the substrate and before the removing of the organic light emitting diode adjacent to the through-hole.

In an embodiment, a portion of the encapsulating unit adjacent to the through-hole also may be removed with the organic light emitting diode in removing the organic light emitting diode adjacent to the through-hole.

In an embodiment, the method may further include forming an opening unit penetrating the circuit unit and the encapsulating unit after the removing of the organic light emitting diode, and the opening unit may be arranged at a location corresponding to the through-hole.

In an embodiment, a width of the opening unit may be equal to or less than that of the through-hole.

In an embodiment, the method may further include removing the carrier substrate and attaching a protecting film before the forming of the opening unit, and the opening unit may be configured to penetrate the protecting film, the circuit unit, and the encapsulating unit.

In an embodiment, the protecting film may include a top protecting film attached to a top portion of the encapsulating unit and a bottom protecting film attached to a bottom portion of the substrate opposite to the top portion of the encapsulating unit.

According to one or more embodiments, an organic light emitting display apparatus may include: a substrate having a first surface, a second surface opposite to the first surface, and a through-hole penetrating from the first surface to the second surface; a humidity preventing layer on the substrate; a circuit unit on the substrate and including an opening unit arranged at a location corresponding to the through-hole; and an organic light emitting diode on a top portion of the circuit unit. Here, the humidity preventing layer may be an organic/inorganic composite layer.

In an embodiment, the substrate may include a third surface perpendicular to the second surface, and the humidity preventing layer may be disposed on an outskirt portion of the substrate adjacent to the second and third surfaces.

In an embodiment, a width of the opening unit may be equal to or less than that of the through-hole.

In an embodiment, a bottom protecting film on a bottom portion of the substrate and a top protecting film on a top portion of the organic light emitting diode may be further included, and the opening unit penetrates through the top and bottom protecting films.

BRIEF DESCRIPTION OF THE DRAWINGS

These and/or other aspects will become apparent and more readily appreciated from the following description of the embodiments, taken in conjunction with the accompanying drawings in which:

FIGS. 2A through 2F are cross-sectional views, cut along the line II-II' in FIG. 1, sequentially illustrating a method of manufacturing an organic light emitting display apparatus according to one or more embodiments.

DETAILED DESCRIPTION

Figure 1:
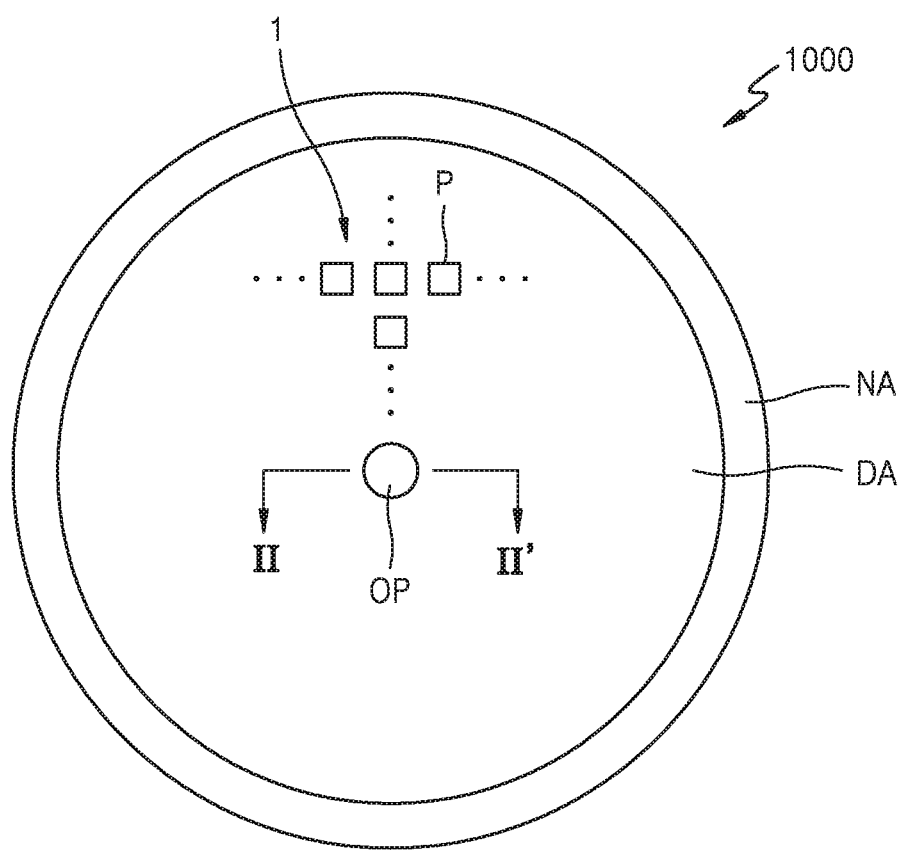
FIG. 1 is a plan view of an organic light emitting display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in more detail by explaining exemplary embodiments of the inventive concept with reference to the attached drawings. Like reference numerals in the drawings denote like elements.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

It will be understood that when a layer, region, or component is referred to as being "disposed on" another layer, region, or component, it can be directly or indirectly disposed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIG. 1 is a plan view of an organic light emitting display apparatus 1000 according to an embodiment.

Referring to FIG. 1, the organic light emitting display apparatus 1000 may include a display area (DA) and a non-display area (NA).

In the display area (DA), an opening unit (e.g., an opening) (OP) may be arranged and a pixel array 1 including pixels (P) surrounding the opening unit (OP) may be arranged. Each of the pixels (P) of the pixel array 1 may include a circuit unit (e.g., a circuit) and an organic light emitting diode electrically connected to the circuit unit, and may provide a certain image via light emitted from the organic light emitting diode.

The non-display area (NA) may be configured to surround the display area (DA), and may include drivers such as a scan driver transmitting a certain signal to each pixel (P) of the display area (DA) and a data driver.

A case in which the opening unit or opening (OP) is arranged at the center of the display area (DA) of the organic light emitting display apparatus 1000 is illustrated in FIG. 1; however, the present inventive concept is not limited thereto. The opening unit or opening (OP) may be arranged at any suitable location in the display area (DA) while being surrounded by pixels P, and its location is not limited.

A case in which the opening unit (OP) is a circle (e.g., shaped as a circle) and one opening unit (OP) is formed is illustrated in FIG. 1; however, the present inventive concept is not limited thereto. Shapes of the opening unit (OP) may be various suitable ones (such as polygonal and/or elliptical), and the number of opening units (OP) may not be limited.

A case in which the display area (DA) is a circle is illustrated in FIG. 1; however, the present inventive concept is not limited thereto. The shape of the display area (DA) may be various suitable ones (such as polygonal and/or elliptical).

FIGS. 2A through 2F are cross-sectional views, cut along the line II-II' in FIG. 1, sequentially illustrating a method of manufacturing an organic light emitting display apparatus 1000 according to one or more embodiments.

Figure 2A:
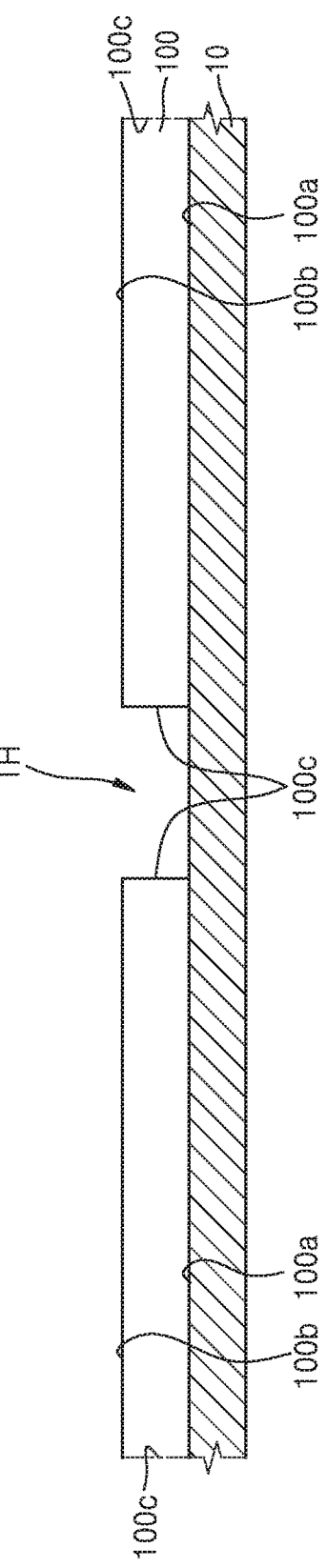

Referring to FIG. 2A, the method of manufacturing the organic light emitting display apparatus 1000 may include (utilizing) a substrate 100 on a carrier substrate 10 according to an embodiment.

In another embodiment, the carrier substrate 10 may include transparent glass materials having silicon oxide (e.g., $SiO_2$) as a main component.

In a process of manufacturing the organic light emitting display apparatus 1000, the substrate 100 may be temporarily on the carrier substrate 10, and the carrier substrate 10 may be removed in a subsequent process.

The substrate 100 may include a first surface 100a and a second surface 100b opposite to the first surface 100a, and may include a transparent plastic material in another embodiment. Plastic materials may include organic materials selected from insulating organic materials including, e.g., polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

The organic light emitting display apparatus 1000 may include the substrate 100 which has a flexible property and thus, is capable of two-dimensional elongation according to an embodiment.

The substrate 100 may include materials having a Poisson's ratio of about 0.4 or more in another embodiment. The Poisson's ratio denotes the ratio of transverse contraction strain to longitudinal extension strain in the direction of a stretching force.

The flexibility of the substrate 100 may be enhanced and accordingly, the organic light emitting display apparatus 1000 may be easily bendable or foldable, by ensuring that materials composing the substrate 100 have a Poisson's ratio of about 0.4 or more, that is, the substrate 100 may have a good stretching property.

Referring to FIG. 2A, the substrate 100 may include a through-hole (TH) penetrating from the first surface 100a to the second surface 100b.

The through-hole (TH) may be formed by removing the substrate 100 from the first surface 100a to the second surface 100b via methods such as femto laser in certain arbitrary areas; however, the method of forming the through-hole (TH) by removing the substrate 100 is not limited thereto.

The through-hole (TH) is illustrated as being at the center of the substrate 100 in FIG. 2A; however, the present inventive concept is not limited thereto.

The through-hole (TH) may be configured anywhere to penetrate from the first surface 100a to the second surface 100b of the substrate 100 and its location is not limited.

A third surface 100c of the substrate 100 may be additionally exposed to the outside as the through-hole (TH) is formed. The third surface 100c may denote a surface perpendicular to the second surface 100b, that is, a side surface of the substrate 100.

Third surfaces 100c (i.e., original third surfaces 100c), that is, side surfaces, are originally at both ends of the substrate 100 from the beginning, and third surfaces 100c (i.e., additional side surfaces 100c) may be additionally formed via forming the through-hole (TH), as illustrated in FIG. 2A.

Figure 2B:
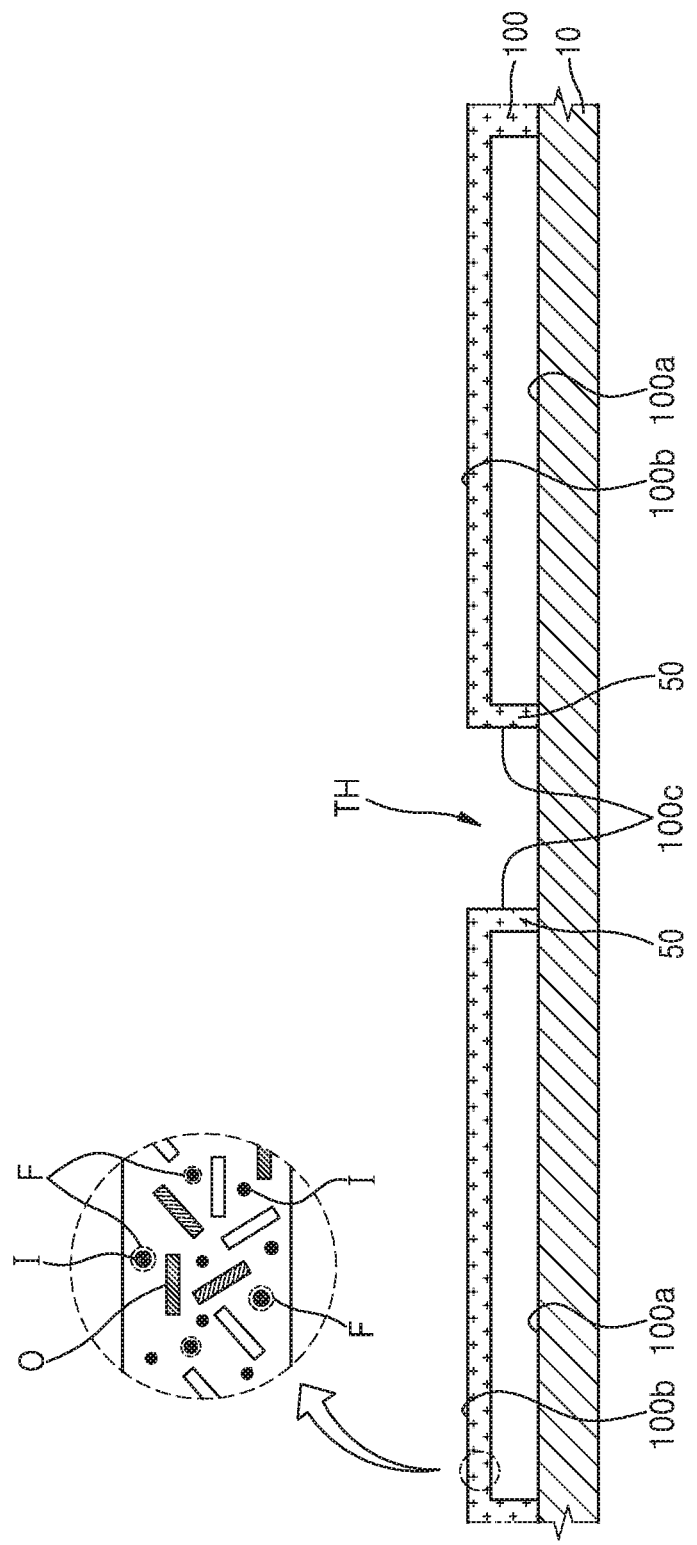

Next, referring to FIG. 2B, a humidity preventing layer 50 may be disposed on the substrate 100 having the through-hole (TH) formed therein.

The humidity preventing layer 50 may reduce or prevent external oxygen or humidity from infiltrating into the substrate 100. For example, the infiltration of oxygen or humidity into the substrate 100 via the third surface 100c may be effectively reduced or prevented in a subsequent process.

Since the infiltration of oxygen or humidity into the substrate 100 may be reduced or prevented, damage, due to oxygen or humidity on a thin film transistor, the organic light emitting diode, etc., which are to be subsequently arranged on the substrate 100, may be reduced or prevented.

In another embodiment, the humidity preventing layer 50 may be an organic/inorganic composite layer including organic/inorganic materials. In other words, the humidity preventing layer 50 may include both organic and inorganic materials.

For example, the humidity preventing layer 50 may include metal oxides or metal nitrides, and in more detail, inorganic materials may include silicon oxide (e.g., $SiO_2$), silicon nitride (e.g., $SiN_x$), silicon oxynitride (e.g., SiON), aluminum oxide (e.g., $Al_2O_3$), titanium dioxide (e.g., $TiO_2$), tantalum oxide (e.g., $Ta_2O_5$), hafnium dioxide ($HfO_2$), or zirconium dioxide ($ZrO_2$).

In addition, the humidity preventing layer 50 may include an insulating organic material forming the substrate 100. For example, organic materials selected from polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP) may be included.

In another embodiment, the humidity preventing layer 50 may not be disposed on surfaces of the substrate 100, that is, on top of the substrate 100, but may be disposed inside the substrate 100, as illustrated in FIG. 2B.

In other words, the humidity preventing layer 50 may be disposed on the outskirt portion of the substrate 100 and inside the substrate 100 (e.g., in the portion of the substrate that is close to its surface and including the surface portion).

In another embodiment, the humidity preventing layer 50 may be disposed inside the substrate 100 adjacent to the second surface 100b and the third surface 100c of the substrate 100. In other words, the humidity preventing layer 50 may be disposed on the outskirt portion close to surfaces facing the outside, and disposed inside the substrate 100 on the carrier substrate 10.

As the through-hole (TH) is disposed in the substrate 100, there may be a concern that the infiltration of external oxygen or humidity via the third surface 100c, that is, side surfaces of the substrate 100, may easily occur.

Accordingly, the method of manufacturing the organic light emitting display apparatus 1000 according to an embodiment may form the humidity preventing layer 50 inside the substrate 100 adjacent to the third surface 100c, that is, on the outskirt portion of the substrate 100 and may effectively reduce or prevent the infiltration of external oxygen or humidity via the third surface 100c, even though the through-hole (TH) is formed.

In addition, a layer including the inorganic material for reducing or preventing the infiltration may not be additionally disposed on the substrate 100. Rather, the organic/inorganic composite layer may be formed inside the substrate 100 via a sequential vapor infiltration (SVI) process (to be described below) and thus, a reduction in flexibility via stress concentration in an inorganic layer may be reduced or prevented.

An arbitrary thickness (e.g., a suitable thickness) of the humidity preventing layer 50 is determined and in FIG. 2B, the thickness of the humidity preventing layer 50 is illustrated as uniform for the sake of convenience; however, the present disclosure is not limited thereto and the thickness of the humidity preventing layer 50 may not have to be uniform.

In another embodiment, the humidity preventing layer 50 may be formed via an SVI process. A process of forming the humidity preventing layer 50 via the SVI process will be briefly described below with reference to FIG. 2B.

As described above, the substrate 100 may include organic materials (O) (e.g., a plurality of organic material molecules) and there may be a free volume (F) between the plurality of organic materials (O), as illustrated in FIG. 2B.

In FIG. 2B, the plurality of organic materials (O) are illustrated as having an arbitrary shape and the plurality of free volumes (F) between the plurality of organic materials (O) are illustrated in dashed lines for the sake of convenience; however, the number, occurrence locations, and sizes of the free volumes (F) are not limited thereto.

Since the free volumes (F) may provide paths of infiltration of oxygen or humidity when the through-hole (TH) is formed, oxygen or humidity may infiltrate via the free volumes (F) on the third surface 100c of the substrate 100.

Thus, an inorganic precursor may be injected into the free volumes (F) in the SVI process via the method of manufacturing the organic light emitting display apparatus 1000 according to an embodiment.

The inorganic precursor may be subsequently changed to an inorganic material (I) via a reaction with a reactant, etc., and thus, any suitable material capable of filling the free volumes (F) may be utilized.

In another embodiment, the inorganic precursor may be trimethylaluminum (TMA, $((CH_3)_3Al)_2$).

The reactant may be added after having injected the inorganic precursor to the free volumes (F). In other words, the reactant may be added, the inorganic precursor which has been injected into the free volumes (F) may react with the reactant, and the inorganic precursor may be changed to the inorganic material (I).

In another embodiment, when the inorganic precursor is trimethylaluminum (TMA, $((CH_3)_3Al)_2$), the reactant to be added may be $H_2O$. In other words, $((CH_3)_3Al)_2$, the inorganic precursor, may react with $H_2O$ and be changed to $Al_2O_3$, the inorganic material (I) filling the free volumes (F) between organic materials (O).

In this case, the inorganic material filling the free volumes F between organic materials (O) may be aluminum oxide (e.g., $Al_2O_3$). In more detail, the inorganic precursor, $((CH_3)_3Al)_2$ may react with $H_2O$, the reactant, and be changed to $Al_2O_3$, the inorganic material (I).

As a result, as illustrated in FIG. 2B, the inorganic material (I) may fill the free volumes (F) between organic materials (O), which are on the outskirt portion of the substrate 100 close to the second surface 100b and the third surface 100c, and may form the humidity preventing layer 50, the organic/inorganic composite layer.

In another embodiment, a top surface of the humidity preventing layer 50 may be rough.

Thus, the organic light emitting display apparatus 1000 manufactured via the method of manufacturing the organic light emitting display apparatus 1000 according to an embodiment may have the humidity preventing layer 50 disposed on the inside and the outskirt portion close to surfaces of the substrate 100. Thus, infiltration paths of oxygen or humidity into the substrate 100 may be blocked and the reliability of the organic light emitting diode may be enhanced.

Next, referring to FIG. 2C, a circuit unit including a thin film transistor (TFT) may be disposed on the substrate 100 having the humidity preventing layer 50 disposed thereon and on the carrier substrate 10.

Firstly, a buffer layer 110 may be disposed on the substrate 100. The buffer layer 110 may reduce or prevent a dispersion of ions of impurities, reduce or prevent an infiltration of external humidity or air, and function as a barrier layer and/or a blocking layer to flatten the surface of the substrate 100.

A thin film transistor (TFT) may be on the buffer layer 110. A case of a top gate TFT, in which an active layer (A), a gate electrode (G), a source electrode (S), and a drain electrode (D) are sequentially formed, is described below; however, the present disclosure is not limited thereto and various suitable types such as a bottom gate TFT may be utilized.

The active layer (A) may be disposed on the buffer layer 110. The active layer A may include poly-silicon and may include a channel region doped with no impurities, and a source region and a drain region which are respectively at both sides of the channel region and respectively doped with impurities. Impurities may vary depending on a kind of the TFT and may include n-type impurities or p-type impurities.

A gate insulating layer 210 may be disposed on the entire surface of the substrate 100 and the carrier substrate 10 to cover the active layer (A). The gate insulating layer 210 may include inorganic materials such as silicon oxides and silicon nitrides, and may include a multi-layer or a single layer. The gate insulating layer 210 may insulate the active layer A from the gate electrode G on the gate insulating layer 210.

The gate electrode G may be disposed on the gate insulating layer 210 after the gate insulating layer 210 has been disposed. The gate electrode G may be formed via a photolithography process and/or an etching process.

Materials for the gate electrode G may include at least one of metals selected from Mo, Al, Pt, Pd, Ag, Mg, Au, Ni, Nd, Ir, Cr, Li, Ca, Ti, W, and Cu.

An interlayer insulating layer 230 may be disposed on the entire surface of the substrate 100 and the carrier substrate 10, after the gate electrode G has been disposed.

The interlayer insulating layer 230 may include inorganic or organic materials. In some embodiments, the interlayer insulating layer 230 may include inorganic materials. For example, the interlayer insulating layer 230 may include metal oxides and/or metal nitrides, and in more detail, the inorganic materials may include $SiO_2$, $SiN_x$, SiON, $Al_2O_3$, $TiO_2$, $Ta_2O_5$, $HfO_2$, and/or $ZrO_2$.

The interlayer insulating layer 230 may include inorganic materials such as silicon oxides ($SiO_x$) and/or silicon nitrides ($SiN_x$), and may include a multi-layer or a single layer. In some embodiments, the interlayer insulating layer 230 may be configured to have a dual layer structure of SiOx/SiNy or SiNx/SiOy.

The interlayer insulating layer 230 may insulate circuits on the gate electrode (G) and the interlayer insulating layer 230.

The source electrode (S) and the drain electrode (D) of the TFT may be on a top portion of the interlayer insulating layer 230.

In another embodiment, the source electrode (S) and the drain electrode (D) may include at least one of metals selected from Al, Pt, Pd, Ag, Mg, Au, Ni, Nd, Ir, Cr, Li, Ca, Mo, Ti, W and Cu.

A via layer 250 may be on the entire surface of the substrate 100 and the carrier substrate 10 to cover the source electrode S and the drain electrode D.

The via layer 250 may include insulating materials. For example, the via layer 250 may include inorganic materials, organic materials, or a combination of organic/inorganic materials; have a single layer structure or a multi-layer structure; and be formed via various suitable deposition methods. In some embodiments, the via layer 250 may include at least one of polyacrylic resin, epoxy resin, phenolic resin, polyimide-based resin, polyimide-based resin, unsaturated polyester-based resin, polyphenylene-based resin, polyphenylene sulfides-based resin and benzocyclobutene (BCB).

A pixel defining layer 270 may be on a top portion of the via layer 250. The pixel defining layer 270 may define a pixel region and a non-pixel region. The pixel defining layer 270 may include an opening 270a which may expose a first electrode 281 to be described below, and may be configured to cover the entire surface of the substrate 100 and the carrier substrate 10.

An intermediate layer 283, to be described below, may be disposed on the opening 270a, and the opening 270a may be an actual pixel region.

Next, referring to FIG. 2D, after the circuit unit has been disposed on the carrier substrate 10 and the substrate 100, on which the humidity preventing layer 50 has been disposed, the organic light emitting diode (OLED) electrically connected to the circuit unit may be disposed on the circuit unit.

In other words, the OLED may be on the top portion of the via layer 250. The OLED may include the first electrode 281, the intermediate layer 283 including an organic light emitting layer, and a second electrode 285. Holes and electrons injected from the first electrode 281 and the second electrode 285 of the OLED may combine in the organic light emitting layer of the intermediate layer 283 and generate light.

The first electrode 281 and/or the second electrode 285 may include a transparent electrode or a reflective electrode. When the transparent electrode is equipped (e.g., provided), the transparent electrode may include ITO, IZO, ZnO and/or $In_2O_3$. When the reflective electrode is equipped (e.g., provided), the reflective electrode may include a reflective layer including Ag, Mg, Al, Pt, Pd, Au, Ni, Nd, Ir, Cr, or a compound of these metals, and a transparent layer including ITO, IZO, ZnO and/or $In_2O_3$. In some embodiments, the first electrode 281 or the second electrode 285 may have a structure of ITO/Ag/ITO.

The intermediate layer 283 may include the organic emission layer. In another embodiment, the intermediate layer 283 may include the organic emission layer and may further include at least one of a hole injection layer (HIL), a hole transport layer, an electron transport layer, and an electron injection layer. However, the exemplary embodiment is not limited thereto and the intermediate layer 283 may include the organic light emitting layer and further include other various suitable functional layers.

The intermediate layer 283 may be on the first electrode 281, and the second electrode 285 may be on the intermediate layer 283. In some embodiments, the intermediate layer 283 may be formed via a deposition process using a fine metal mask (FMM), and the second electrode 285 may be formed via a vacuum deposition method, etc.

The second electrode 285 may form an electric field with the first electrode 281 so that light may be emitted from the intermediate layer 283. The first electrode 281 may be patterned for each pixel P, and the second electrode 285 may be configured to apply a voltage in common to all pixels P.

Figure 2E:
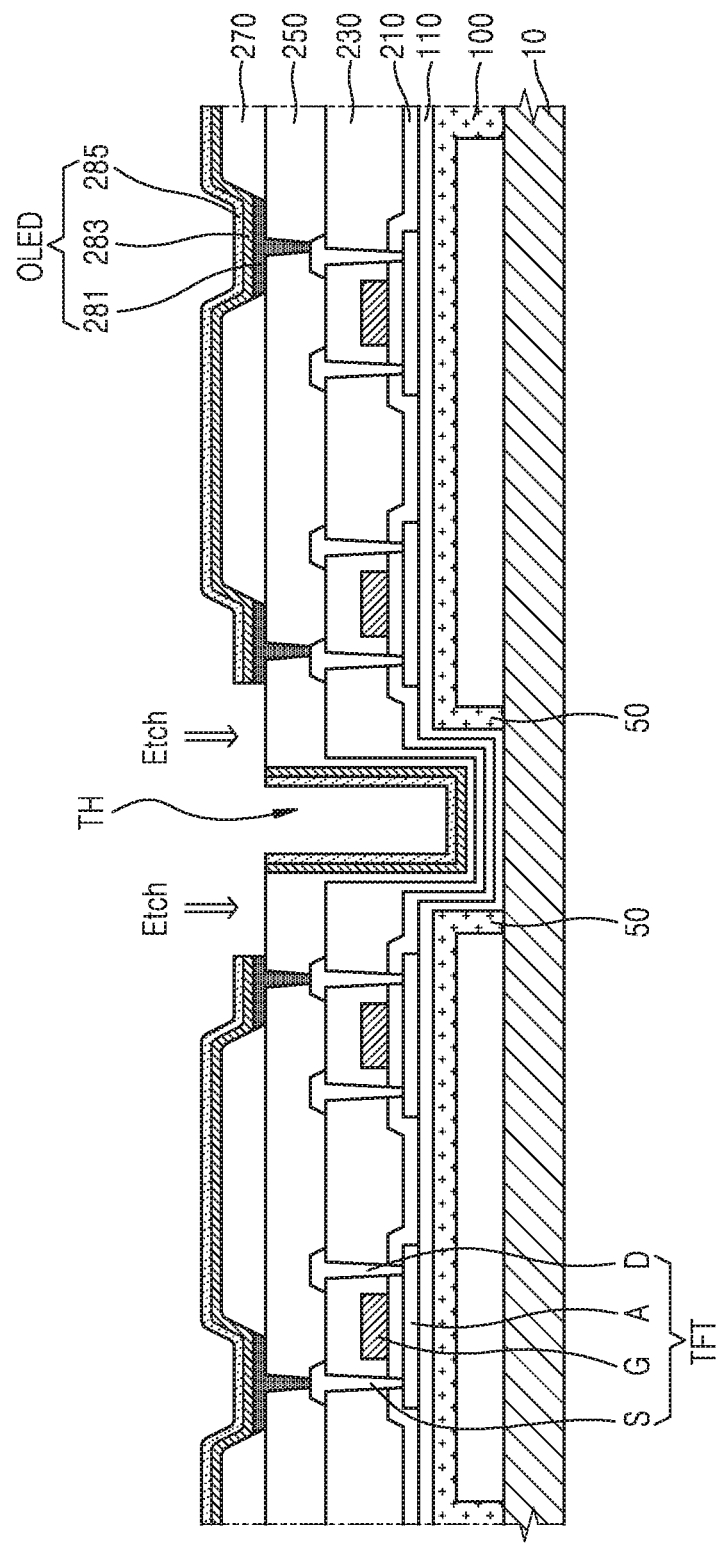

Next, referring to FIG. 2E, the OLED adjacent to the through-hole (TH) may be removed.

As described above, the OLED may include the first electrode 281, the intermediate layer 283, and the second electrode 285. At least a portion of a plurality of layers included in the intermediate layer 283 and the second electrode 285 may be deposited across the board onto (e.g., on the entire surface of) the substrate 100 and the carrier substrate 10.

A portion of the intermediate layer 283 and/or the second electrode 285 which are deposited across the board may be removed via an etching process in the vicinity of the through-hole (TH) in the method of manufacturing the organic light emitting display apparatus 1000 according to an embodiment.

As described below, since the opening unit (OP) of the organic light emitting display apparatus 1000 may be disposed at locations corresponding to the through-hole (TH), the OLED in the vicinity of the through-hole (TH) may be firstly removed before the opening unit (OP) is formed (e.g., disposed).

The reason is that when the opening unit (OP) is disposed later without removing the OLED in the vicinity of the through-hole (TH), side surfaces of the intermediate layer 283 and/or the second electrode 285 of the OLED may be exposed to the outside, which may provide infiltration paths of oxygen and/or humidity.

Accordingly, the method of manufacturing the organic light emitting display apparatus 1000 according to an embodiment may be enhanced in blocking infiltration paths of oxygen and/or humidity through the side surfaces via removing of a portion of the OLED, especially the intermediate layer 283 and/or the second electrode 285, in the vicinity of the through-hole (TH) before forming the opening unit (OP).

Figure 2F:
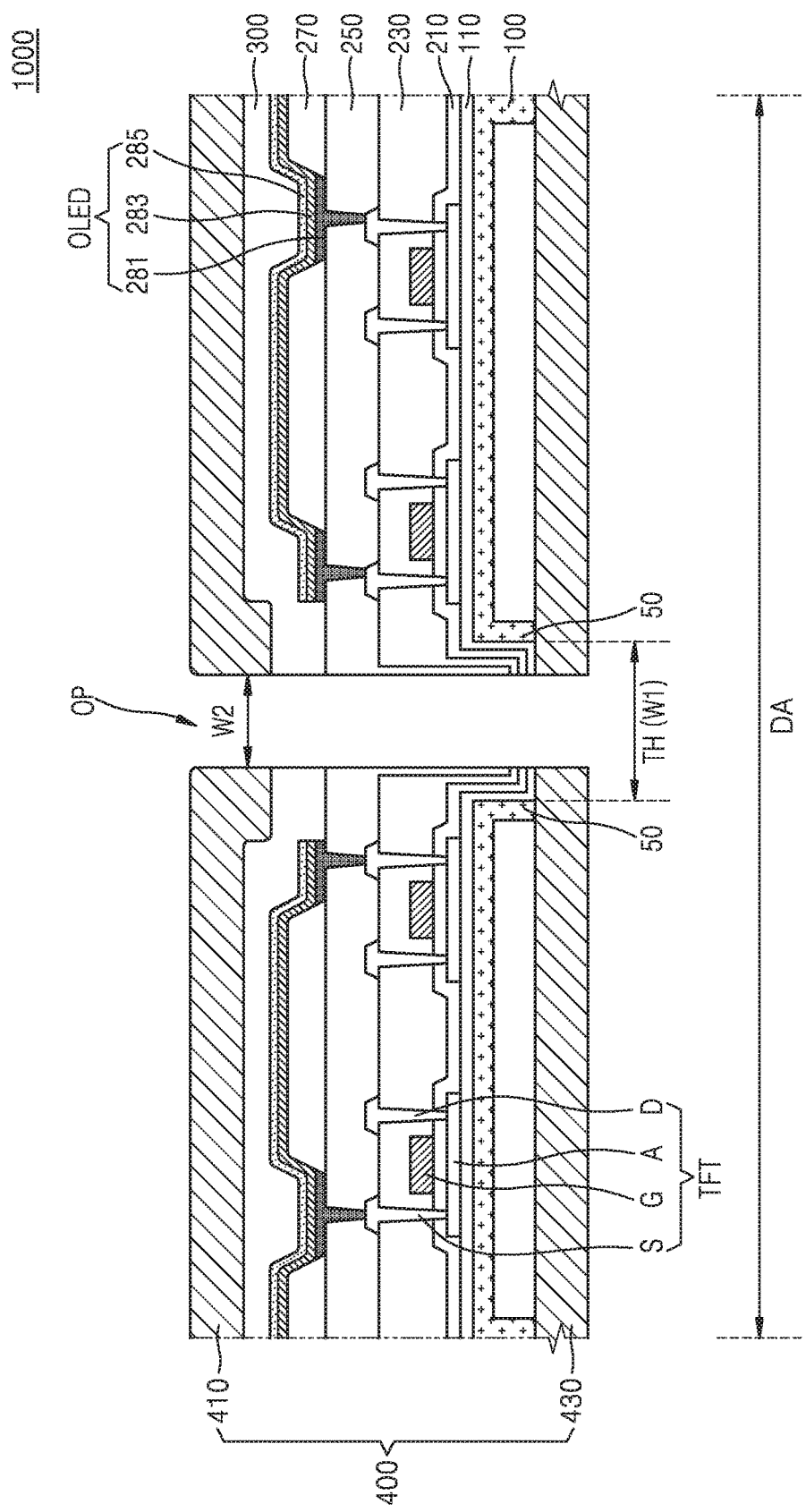

Next, referring to FIG. 2F, an encapsulating unit 300 encapsulating the OLED may be disposed on a top portion of the OLED.

The encapsulating unit 300 may protect the plurality of TFT's on the substrate 100 and the carrier substrate 10, the OLED, etc., from infiltration of external humidity, oxygen, etc.

A shape of the encapsulating unit 300 may not be limited, and any suitable shape may be applied as long as the OLED may be encapsulated.

In another embodiment, the encapsulating unit 300 may include an encapsulating material, or may be formed in a thin film encapsulation shape (e.g., in a thin film structure).

The encapsulating unit 300 is illustrated as one layer (e.g., a single layer) in FIG. 2F for the sake of convenience; however, when the encapsulating unit 300 is formed in the thin film encapsulation shape, a plurality of films may be laminated to form the encapsulating unit 300.

In another embodiment, the encapsulating unit 300 may be formed in the thin film encapsulation shape in which a plurality of organic layers and a plurality of inorganic layers are alternatively laminated.

The inorganic layer may tightly reduce or prevent the infiltration of oxygen and/or humidity, while the organic layer may provide flexibility via absorbing stress of the inorganic layer.

The inorganic layer may be a single layer or a laminated layer including metal oxides and/or metal nitrides. In another embodiment, the inorganic layer may include any one of SiNx, $Al_2O_3$, $SiO_2$, and $TiO_2$.

The organic layer may include a polymer, and may be, for example, a single layer or a laminated layer including any one of PET, polyimide, PC, epoxy, polyethylene, and PAR. For example, the organic layer may be PAR. In more detail, the organic layer may include a polymerized monomer composition including diacrylate monomer and triacrylate monomer. The monomer composition may further include monoacrylate monomer in another embodiment. In addition, the monomer composition may further include a photoinitiator such as thermoplastic olefin (TPO); however, it is not limited thereto.

Next, referring to FIG. 2F, the carrier substrate 10 which has been temporarily attached may be removed from the substrate 100 and a protecting film 400 may be attached.

In another embodiment, the protecting film 400 may include any suitable material selected from polyethylene terephthalate (PET), polyethylene napthalate (PEN), polyethersulphone (PES), polyetherimide (PEI), polyethylene (PE), urethane and polycarbonate.

The protecting film 400 may include a top protecting film 410 attached to the top portion of the encapsulating unit 300 and a bottom protecting film 430 attached to the bottom portion of the substrate 100. Both the top protecting film 410 and the bottom protecting film 430 are attached in an embodiment illustrated in FIG. 2F; however, it is merely an example, and only one of the top protecting film 410 or the bottom protecting film 430 may be attached.

As the top protecting film 410 is attached to the top portion of the encapsulating unit 300, the encapsulating unit 300 may perform a function of protecting the OLED from external humidity and/or oxygen via a complete encapsulation and at the same time, may protect the OLED via an additional formation of the top protecting film 410.

The bottom protecting film 430, which is attached to the bottom portion of the substrate 100, may also protect the organic light emitting display apparatus 1000 from an impact, etc., of the outside.

In another embodiment, the top protecting film 410 and the bottom protecting film 430 may include an adhesive layer which may be (e.g., which is) an acrylic strong-adhesive film.

After the top protecting film 410 and the bottom protecting film 430 are attached, the opening unit (OP) may be formed (e.g., disposed) at locations corresponding to the through-hole (TH). In other words, the opening unit (OP) may be formed (e.g., disposed) within a location where the through-hole (TH) is disposed, as illustrated in FIG. 2F.

In another embodiment, the opening unit (OP) may be configured to penetrate from the bottom surface of the bottom protecting film 430 to the top surface of the top protecting film 410 via a $CO_2$ laser, etc.

The opening unit (OP) may be formed as a hole via physical removing at least a portion of the components arranged inside the through-hole (TH). A formation method of the opening unit (OP) is not limited thereto and the opening unit (OP) may be formed via various suitable methods.

In another embodiment, the opening unit (OP) may be configured to penetrate the circuit unit and the encapsulating unit 300 arranged inside the through-hole (TH).

In another embodiment, as illustrated in FIG. 2F, the opening unit (OP) may be configured to penetrate not only the circuit unit and the encapsulating unit 300, but also the top protecting film 410 and the bottom protecting film 430.

As described in detail above, the opening unit (OP) may be disposed at locations corresponding to the through-hole (TH) and in another embodiment, a width W2 of the opening unit (OP) may be equal to or less than a width W1 of the through-hole (TH).

The opening unit (OP) may be formed such that the width W2 of the opening unit (OP) is less than the width W1 of the through-hole (TH), as illustrated in FIG. 2F, via the method of manufacturing the organic light emitting display apparatus 1000 according to an embodiment.

When the opening unit (OP) is configured to penetrate the organic light emitting display apparatus 1000 in the display area (DA) of the organic light emitting display apparatus 1000, there may be a concern that external oxygen and/or humidity infiltrates via exposed side surfaces.

However, as described in detail above, since the humidity preventing layer 50 is formed inside the substrate 100 via the SVI process, the method of manufacturing the organic light emitting display apparatus 1000 according to embodiments may be enhanced in preventing infiltration of oxygen or humidity through the side surfaces.

As a result, since external humidity and/or oxygen may not infiltrate into the substrate 100, especially via the side surfaces, even with the opening unit (OP) formed, a desired feature of enhancing reliability of the OLED may be obtained.

Figure 3:
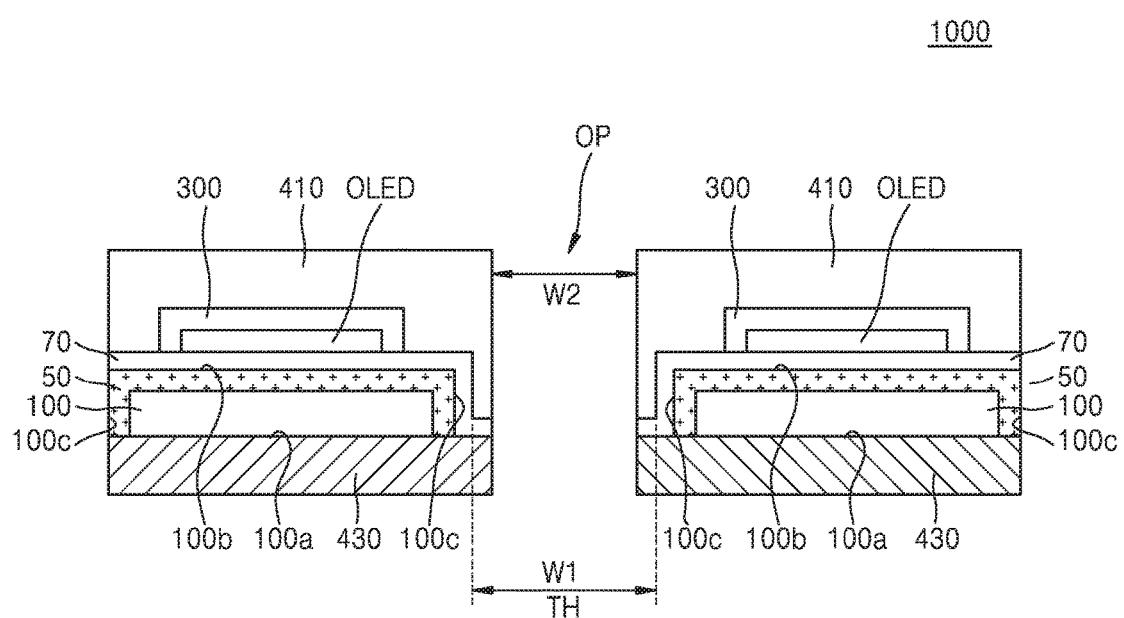
FIG. 3 is a cross-sectional view, cut along the line II-II' in FIG. 1, illustrating an organic light emitting display apparatus which is manufactured according to the method of manufacturing an organic light emitting display apparatus according to one or more embodiments.

FIG. 3 is a cross-sectional view, cut along the line II-II' in FIG. 1, illustrating an organic light emitting display apparatus 1000 which is manufactured according to an embodiment of the organic light emitting display apparatus 1000. In FIG. 3, like reference numerals in FIGS. 2A through 2F denote like elements, and a duplicate description will be omitted for simplicity.

According to an embodiment, the organic light emitting display apparatus 1000 may include the substrate 100 including the through-hole (TH), the humidity preventing layer 50 on the substrate 100, the circuit unit 70 on the substrate 100, and the OLED on the circuit unit 70.

Components such as the circuit unit 70 and the OLED are schematically illustrated for the sake of convenience; however, shapes of these components are not limited thereto.

The substrate 100 may include the first surface 100a, the second surface 100b opposite to the first surface 100a, and the third surface 100c perpendicular to the second surface 100b.

The third surface 100c may be the side surfaces of the substrate 100. The third surface 100c may be additionally exposed due to the through-hole (TH) arranged on the substrate 100.

In another embodiment, the humidity preventing layer 50 may be the organic/inorganic composite layer and be inside the substrate 100.

In another embodiment, the humidity preventing layer 50 may be arranged on the outskirt portion of the substrate 100 adjacent to the second surface 100b and the third surface 100c.

The humidity preventing layer 50 may be the organic/inorganic composite layer formed via the SVI process and may provide an enhancement of preventing infiltration of external humidity or oxygen via the third surface 100c, the side surfaces of the substrate 100, by blocking infiltration paths of humidity of oxygen.

The circuit unit 70 including the TFT may be on the substrate 100 and may include the opening unit (OP).

The OLED electrically connected to the circuit unit 70 may be on the circuit unit 70.

In another embodiment, the OLED may not be arranged in the vicinity of the through-hole (TH). In other words, the organic light emitting display apparatus 1000 according to an embodiment may be manufactured in a state in which the OLED close to the through-hole (TH) is removed.

According to an embodiment, the organic light emitting display apparatus 1000 may further include an encapsulating unit 300 encapsulating each of OLED's.

In another embodiment, since the OLED may not be arranged in the vicinity of the through-hole (TH), the encapsulating unit 300 also may not be arranged in the vicinity of the through-hole (TH).

According to an embodiment, the organic light emitting display apparatus 1000 may further include the protecting film 400 protecting the organic light emitting display apparatus 1000 from external humidity, oxygen, impact, etc.

As illustrated in FIG. 3, the protecting film 400 may include the bottom protecting film 430 on the bottom portion of the first surface 100a and the top protecting film 410 on the top portion of the encapsulating unit 300; however, it is not limited thereto, and only the top protecting film 410 or the bottom protecting film 430 may be included.

In another embodiment, the top protecting film 410 and/or the bottom protecting film 430 may include an opening corresponding to the opening unit (OP), like the circuit unit 70.

As illustrated in FIG. 3, the organic light emitting display apparatus 1000 according to an embodiment may include the opening unit (OP) penetrating the organic light emitting display apparatus 1000.

In another embodiment, the opening unit (OP) may be arranged at locations corresponding to the through-hole (TH), that is, inside the through-hole (TH).

The width W2 of the opening unit (OP) may be equal to or less than the width W1 of the through-hole (TH).

In another embodiment, the opening unit (OP) may be configured to penetrate the circuit unit 70, the top protecting film 410, and the bottom protecting film 430.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing an organic light emitting display apparatus, the method comprising:
    preparing a substrate having a first surface and a second surface opposite to the first surface;
    forming a through-hole penetrating the substrate from the first surface to the second surface;
    forming a humidity preventing layer on the substrate;
    forming a plurality of organic light emitting diodes on the substrate; and
    removing an organic light emitting diode adjacent to the through-hole from among the plurality of organic light emitting diodes,
    wherein the humidity preventing layer is formed on the substrate via a sequential vapor infiltration (SVI) process.

2. The method of manufacturing the organic light emitting display apparatus of claim 1, wherein the substrate has a third surface perpendicular to the second surface, and the humidity preventing layer is disposed on an outskirt portion of the substrate adjacent to the second and third surfaces.

3. The method of manufacturing the organic light emitting display apparatus of claim 1, wherein the humidity preventing layer comprises an organic/inorganic composite layer.

4. The method of manufacturing the organic light emitting display apparatus of claim 3, wherein the substrate comprises an organic material and a free volume.

5. The method of manufacturing the organic light emitting display apparatus of claim 4, wherein the humidity preventing layer on the substrate is formed via the SVI process, wherein an inorganic precursor penetrates into the free volume.

6. The method of manufacturing the organic light emitting display apparatus of claim 1, wherein the substrate is on a carrier substrate in preparing the substrate.

7. The method of manufacturing the organic light emitting display apparatus of claim 6, further comprising disposing a circuit unit on the substrate and the carrier substrate after the forming of the humidity preventing layer on the substrate and before the forming of the plurality of the organic light emitting diodes on the substrate.

8. The method of manufacturing the organic light emitting display apparatus of claim 7, further comprising disposing an encapsulating unit encapsulating the organic light emitting diode on the substrate and the carrier substrate after the forming of the plurality of the organic light emitting diodes on the substrate.

9. The method of manufacturing the organic light emitting display apparatus of claim 8, wherein a portion of the encapsulating unit adjacent to the through-hole also is removed with the organic light emitting diode in removing the organic light emitting diode adjacent to the through-hole.

10. The method of manufacturing the organic light emitting display apparatus of claim 8, further comprising forming an opening unit penetrating the circuit unit and the encapsulating unit after the removing of the organic light emitting diode, wherein the opening unit is arranged at a location corresponding to the through-hole.

11. The method of manufacturing the organic light emitting display apparatus of claim 10, wherein a width of the opening unit is equal to or less than that of the through-hole.

12. The method of manufacturing the organic light emitting display apparatus of claim 10, further comprising removing the carrier substrate and attaching a protecting film before the forming of the opening unit, and the opening unit is configured to penetrate the protecting film, the circuit unit, and the encapsulating unit.

13. The method of manufacturing the organic light emitting display apparatus of claim 12, wherein the protecting film comprises a top protecting film attached to a top portion of the encapsulating unit and a bottom protecting film attached to a bottom portion of the substrate opposite to the top portion of the encapsulating unit.

* * * * *